(12) United States Patent
Cheng et al.

(10) Patent No.: US 9,379,110 B1
(45) Date of Patent: Jun. 28, 2016

(54) METHOD OF FABRICATION OF ETSOI CMOS DEVICE BY SIDEWALL IMAGE TRANSFER (SIT)

(71) Applicant: International Business Machines Corporation, Armonk, NY (US)

(72) Inventors: Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/951,756

(22) Filed: Nov. 25, 2015

(51) Int. Cl.
| | |
|---|---|
| *H01L 21/84* | (2006.01) |
| *H01L 27/092* | (2006.01) |
| *H01L 27/12* | (2006.01) |
| *H01L 29/16* | (2006.01) |
| *H01L 29/161* | (2006.01) |
| *H01L 29/10* | (2006.01) |
| *H01L 29/06* | (2006.01) |
| *H01L 21/8238* | (2006.01) |
| *H01L 21/3065* | (2006.01) |
| *H01L 21/308* | (2006.01) |

(52) U.S. Cl.
CPC .......... *H01L 27/0922* (2013.01); *H01L 21/308* (2013.01); *H01L 21/3065* (2013.01); *H01L 21/823807* (2013.01); *H01L 21/823878* (2013.01); *H01L 21/84* (2013.01); *H01L 27/1203* (2013.01); *H01L 29/0653* (2013.01); *H01L 29/1054* (2013.01); *H01L 29/16* (2013.01); *H01L 29/161* (2013.01)

(58) Field of Classification Search
CPC ................ H01L 27/0922; H01L 21/84; H01L 21/823807; H01L 21/823878
USPC .......................................................... 438/154
See application file for complete search history.

(56) References Cited

U.S. PATENT DOCUMENTS

| | | | | |
|---|---|---|---|---|
| 6,858,478 | B2 * | 2/2005 | Chau ...................... | B82Y 10/00 257/E29.137 |
| 7,608,489 | B2 * | 10/2009 | Chidambarrao | H01L 21/823807 257/213 |
| 8,309,447 | B2 | 11/2012 | Cheng et al. | |
| 8,643,061 | B2 * | 2/2014 | Yin ................... | H01L 21/76254 257/19 |
| 9,093,533 | B2 | 7/2015 | Cheng et al. | |
| 2012/0276695 | A1 * | 11/2012 | Cheng ................. | H01L 27/1211 438/154 |
| 2015/0200205 | A1 | 7/2015 | Cheng et al. | |
| 2015/0206744 | A1 | 7/2015 | Cheng et al. | |
| 2015/0206904 | A1 | 7/2015 | Cheng et al. | |
| 2015/0214117 | A1 | 7/2015 | Cheng et al. | |
| 2015/0255457 | A1 | 9/2015 | Loubet et al. | |

OTHER PUBLICATIONS

Brozek, T. (Ed.) "Micro- and Nanoelectronics Emerging Device Challenges and Solutions", 2015, pp. 105, CRC Press, Boca Raton, FL (1 page).

* cited by examiner

*Primary Examiner* — Luan C Thai
(74) *Attorney, Agent, or Firm* — Cantor Colburn LLP; Steven Meyers

(57) ABSTRACT

Disclosed is a process to prepare extremely thin semiconductor on insulator complementary metal-oxide-semiconductor devices having n-type and p-type metal oxide semiconductor field-effect transistors. The pFET and nFET devices of different strain, size, and geometry are prepared on the same chip without the requirement for an extra mask step.

20 Claims, 12 Drawing Sheets

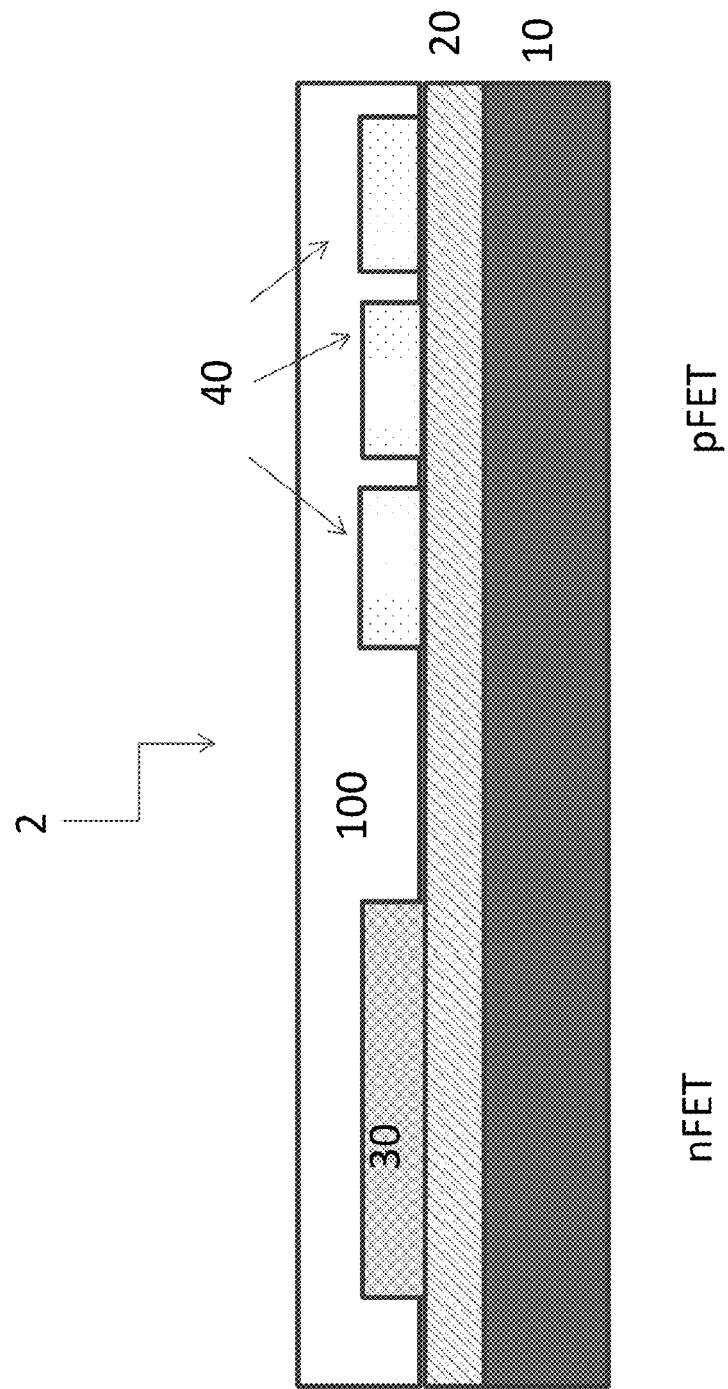

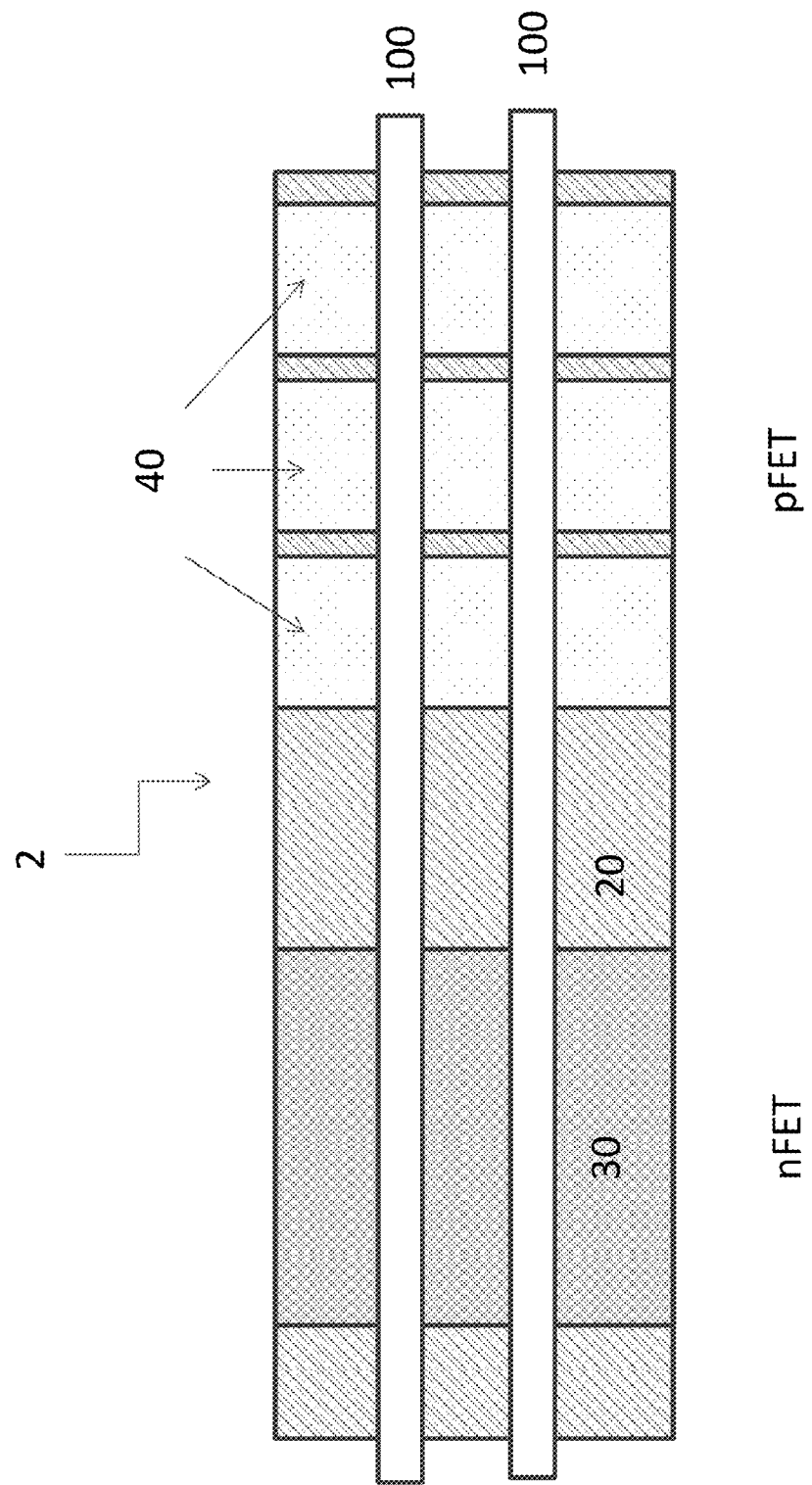

METHOD OF FABRICATION OF ETSOI CMOS DEVICE BY SIDEWALL IMAGE TRANSFER (SIT)

BACKGROUND

The present invention generally relates to methods of making extremely thin semiconductor on insulator complementary metal-oxide-semiconductor (ETSOI CMOS) devices, and more specifically to methods of making ETSOI CMOS having n-type and p-type metal oxide semiconductor field-effect transistors (MOSFETs) prepared from semiconductor films of different strain, size, and geometry.

ETSOI (SOI thickness, for example, <8 nanometers (nm)) is considered as a viable device option for scaling to 20 nm node and beyond. ETSOI is a planar structure and thus device fabrication and process characterization of ETSOI devices are often easier than 3-dimensional devices. ETSOI devices are attractive for low power applications.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and is built with n-doped source and drain junctions. The PFET uses holes as the current carriers and is built with p-doped source and drain junctions.

SUMMARY

In one embodiment, a method comprises forming on a structure comprising a pad layer covering a surface of an nFET region, a pFET region, and a shallow trench isolation (STI) region a plurality of nFET region sacrificial mandrels on the surface of the pad layer in the nFET region and a plurality of pFET region sacrificial mandrels on the surface of the pad layer in the pFET region, wherein the nFET region contains an unstrained semiconductor material and the pFET region comprises a strained semiconductor material; depositing a conformal spacer material film on the surface of the plurality of nFET region sacrificial mandrels, plurality of pFET region sacrificial mandrels, and exposed pad layer; etching to selectively remove conformal spacer material, exposed pad layer, strained semiconductor material, and unstrained semiconductor material layer; and removing remaining conformal spacer material film, the plurality of nFET and pFET sacrificial mandrels, and remaining pad layer to result in a complimentary structure, wherein the complimentary structure comprises the nFET region comprising a solid region of unstrained semiconductor material, and the pFET region comprising a plurality of parallel strained semiconductor material stripes separated by gaps.

In another embodiment, a method comprises forming a shallow trench isolation (STI) region in a structure comprising a SOI substrate comprising a buried oxide (BOX) layer, an unstrained semiconductor material layer contacting a surface of the BOX layer, and a blanket strained semiconductor material layer on a surface of the unstrained semiconductor material layer opposite to the BOX layer by removing a portion of the blanket strained semiconductor material layer and unstrained semiconductor material layer to form an nFET region and a pFET region separated by the STI region, wherein the SOI has a thickness of about 1 to about 10 nm; providing a hardmask on the surface of the STI region, nFET region, and pFET region; removing the hardmask and the blanket strained semiconductor material layer from the nFET region to expose the unstrained semiconductor material layer in the nFET region; removing the hardmask from the pFET region and converting the unstrained semiconductor material layer and the blanket strained semiconductor material layer of the pFET region into a strained semiconductor material channel; forming a pad layer over the surface of the STI region, the nFET region, and the pFET region; forming a plurality of nFET region sacrificial mandrels on the surface of the pad layer in the nFET region and a plurality of pFET region sacrificial mandrels on the surface of the pad layer in the pFET region, the nFET region sacrificial mandrels comprising nFET region mandrel spacing widths (S1) and the pFET region sacrificial mandrels comprising pFET region mandrel spacing widths (S2), wherein S1 is smaller than S2; depositing a conformal spacer material film on the surface of the plurality of nFET region sacrificial mandrels, plurality of pFET region sacrificial mandrels, and exposed pad layer, the conformal spacer material film having a thickness (t) that is greater than half of S1 and less than half of S2; etching to selectively remove conformal spacer material, exposed pad layer, strained semiconductor material, and unstrained semiconductor material layer; and removing remaining conformal spacer material film, the plurality of nFET and pFET sacrificial mandrels, and remaining pad layer to result in a complimentary structure, wherein the complimentary structure comprises the nFET region comprising a solid region of unstrained semiconductor material, and the pFET region comprising a plurality of parallel strained semiconductor material stripes separated by gaps.

In yet another embodiment, a complementary metal-oxide-semiconductor (CMOS) device comprises an nFET device comprising a solid region of unstrained semiconductor material; a pFET device comprising parallel strained semiconductor material stripes separated by gaps, wherein the strained semiconductor material stripes are uniaxially strained, and the gap between the plurality of stripes is small enough to minimize drive current loss; and a shallow trench isolation (STI) region separating the nFET device and the pFET device.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 11A is a side view of an ETSOI CMOS according to the invention.

FIG. 11B is a top view of an ETSOI CMOS according to the invention having gates over wide stripe S1 in the nFET region and narrow width stripe SiGe in the pFET region.

DETAILED DESCRIPTION

Figure 1:
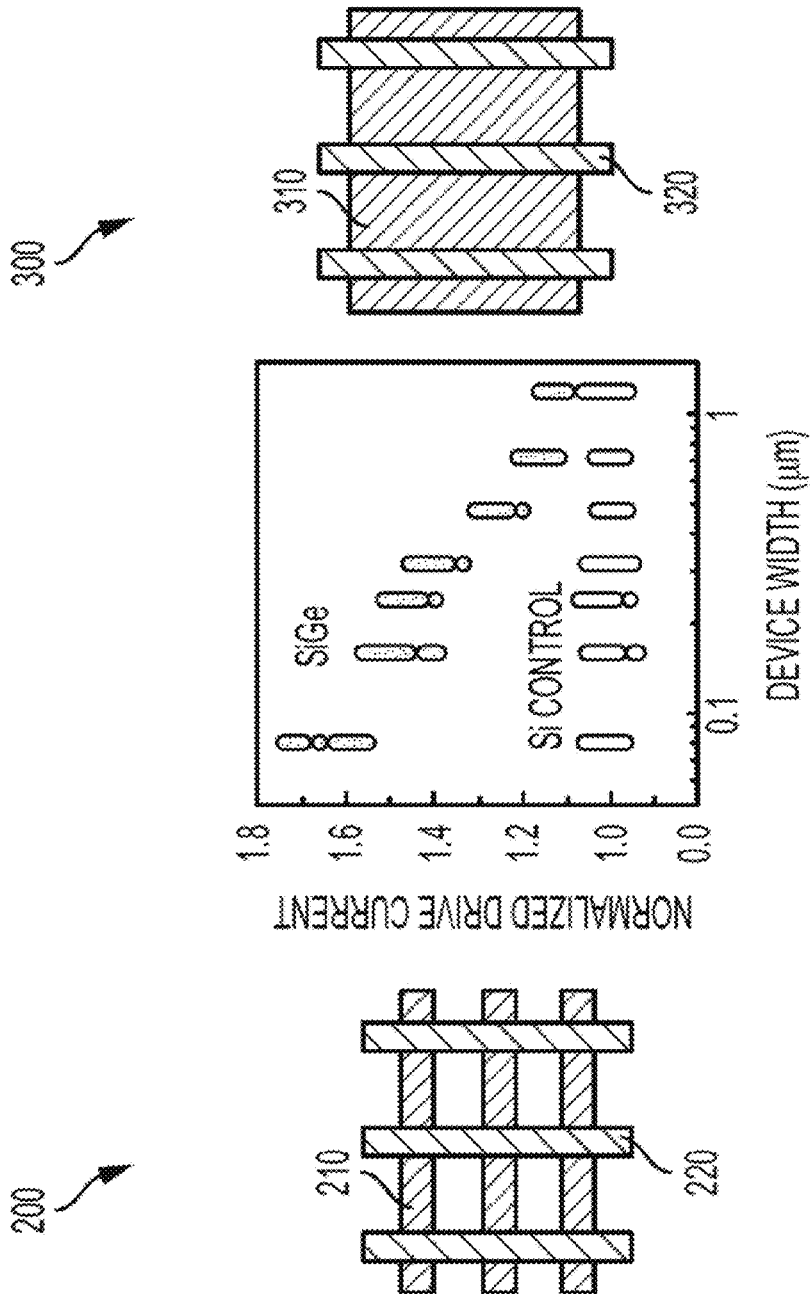
FIG. 1 is a schematic of a narrow width SiGe FET (uniaxial strain), a large width SiGe FET (biaxial strain); and a graph showing normalized drive current as a function of device width for a SiGe FET.

As stated above, the present invention relates to a method of making ETSOI CMOS devices, and more specifically to method of making ETSOI CMOS having n-type and p-type metal oxide semiconductor field-effect transistors (MOSFETs) prepared from semiconductor structures of different strain, size, and geometry, which are now described in detail with accompanying figures. Like reference numerals refer to like elements across different embodiments. The figures are not to scale. As used herein, "extremely-thin SOI or "ETSOI" means a semiconductor on insulator having a thickness of about 10 nm or less, specifically about 1 to about 10 nm, more specifically about 2 to about 8 nm, and yet more specifically about 4 to about 6 nm.

Narrow width, also referred to as "striped", silicon-germanium (SiGe) FET (uniaxial stress) outperforms large width SiGe FET (biaxial stress) (see FIG. 1). Thus, narrow width or striped SiGe can boost pFET performance. Although there is some loss of active area due to the gaps between the stripes, the performance gain by the striped SiGe outweighs the performance loss due to loss in active area as long as the gaps between the stripes is small compared with the width in the stripes. However, for nFET, it is still desired to have wide areas as the striped structure results in the loss of active area due to the gaps between the stripes.

FIG. 1 is a schematic of a narrow width SiGe FET (uniaxial strain) (200) having narrow SiGe stripes (210) and gates (220). FIG. 1 also illustrates a large width SiGe FET (biaxial strain) (300) having wide SiGe (310) regions and gates (320). The graph illustrates normalized drive current as a function of device width for a SiGe FET.

The method of the current invention as described herein allows for the formation of both narrow stripe strained semiconductor material (e.g. SiGe) for pFET where there is minimal gap spacing between the stripes, and solid region (i.e. wide area with no gaps) of unstrained semiconductor material (e.g. Si) for nFET, where both the pFET and nFET devices are prepared on the same chip without the requirement for an extra mask step.

Suitable materials for the semiconductor regions depend on the type of MOSFET (n-type or p-type). Non-limiting examples of suitable materials include silicon, germanium, or silicon-germanium, III-V compounds, II-V compounds, or any combination thereof. The III-V compound semiconductors are obtained by combining group III elements (e.g. Al, Ga, In) with group V elements (e.g. N, P, As, Sb). Non-limiting examples of III-V compound semiconductors include GaAs, InP, GaP and GaN.

A first embodiment will be described according to the FIGS. 2-11B with reference to specific semiconductor materials. Reference to specific materials and processes within the embodiment is not to be construed as limiting and those skilled in the art will be aware of alternative material or processes in the art or discussed herein.

Figure 2:
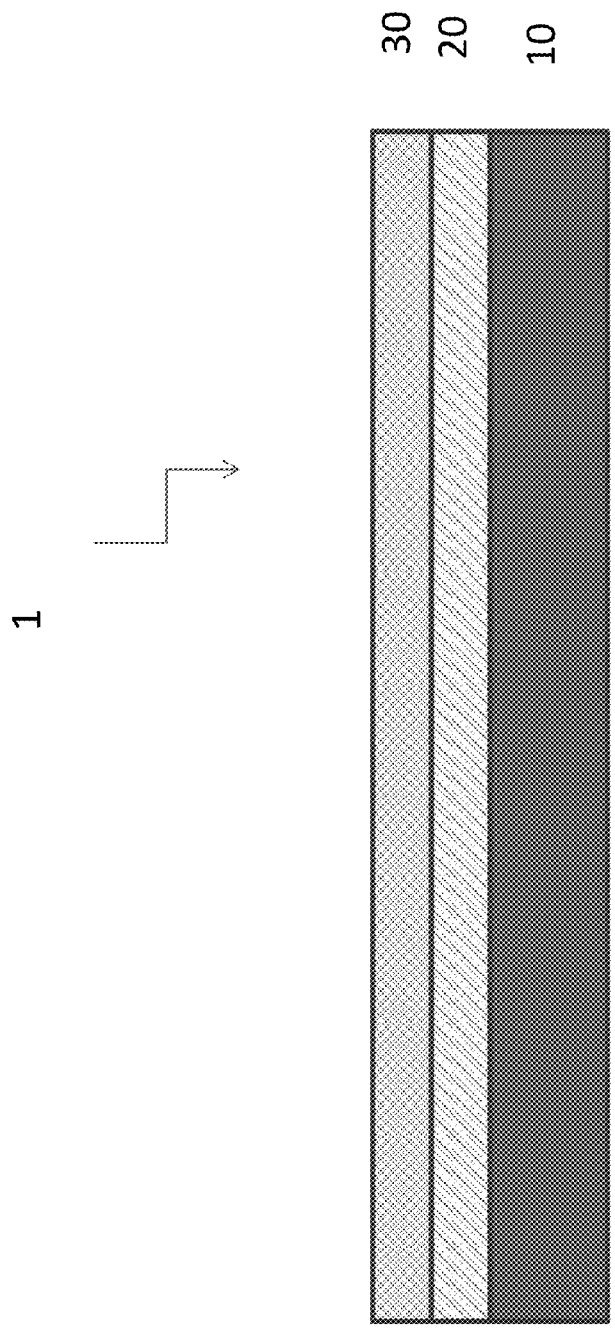
FIG. 2 illustrates an exemplary ETSOI structure.

In one embodiment, a method for forming an ETSOI CMOS device starts with an ETSOI (1), FIG. 2. In FIG. 2 the ETSOI comprises a substrate (10), a BOX layer (20), and an unstrained semiconductor material layer (30). The substrate (10) can be prepared from any suitable material such as silicon, germanium, silicon-germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain. The substrate (10) may be in the form of a wafer.

The "buried oxide" or BOX layer (20) is an insulating layer, usually made of silicon dioxide, or any other insulator/dielectric material such as silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The unstrained semiconductor layer (30) of the ETSOI in the Figures is silicon, although other semiconductor materials disclosed above may be used. The unstrained semiconductor film can be a few nanometers in thickness. In an embodiment, the semiconductor layer (30) is Si.

Figure 3:
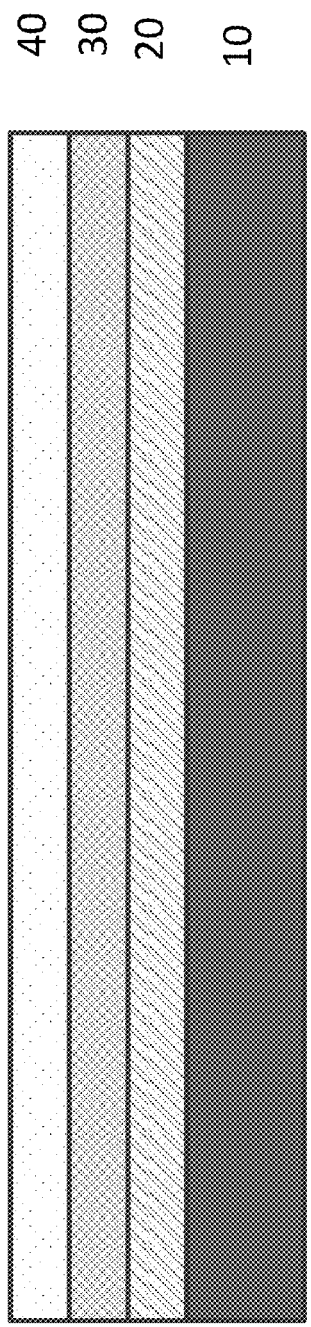
FIG. 3 illustrates an exemplary ETSOI structure with a blanket SiGe epitaxial layer.

A strained semiconductor material layer (40) is formed on the surface of the unstrained Si semiconductor layer (30) of the ETSOI in FIG. 3. Exemplary materials for the strained semiconductor material layer (40) have been described above. For the purposes of the Figures, the strained semiconductor material layer (40) is a blanket epitaxial SiGe layer. The strained semiconductor material layer (40) can be a few nanometers in thickness. The strained semiconductor material layer (40) is compressively strained with biaxial strain due to the lattice mismatch between SiGe and the underlying ETSOI layer. Suitable processes for forming the strained semiconductor material layer (40) involve epitaxially growing SiGe on ETSOI. In one embodiment, the strained semiconductor material layer is biaxially strained SiGe after epitaxy growth. In one embodiment, the germanium atomic concentration in the SiGe layer ranges from 10% to 50%.

Figure 4:
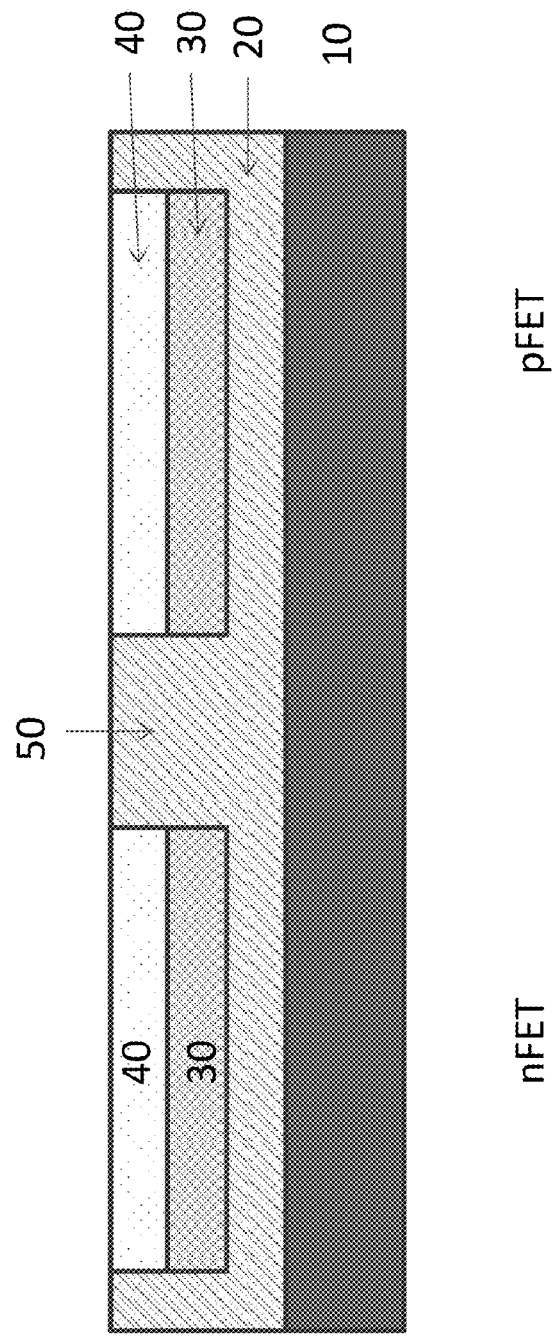
FIG. 4 illustrates an exemplary ETSOI structure with a SiGe epitaxial layer and a shallow trench isolation (STI) region.

A shallow trench isolation (STI) region (50) is formed in the structure shown in FIG. 3, resulting in the structure shown in FIG. 4. A STI region is formed in the structure, for example by reactive ion etching, down to the BOX (20), or at least to the bottom of the unstrained semiconductor material layer (30). Patterning techniques to facilitate trench formation can be used. Shallow trench isolation (STI) provides an isolation region that electrically isolates active areas of the structure and result in a uniform semiconductor channel. In one embodiment, a STI etching and dielectric fill process is performed to form the STI region. The dielectric fill can be, for example, silicon oxide. Alternatively, the trenches may be lined with a silicon oxide liner formed by a thermal oxidation process and then filled with additional silicon oxide or another material. In FIG. 4, subsequent to STI region (50) formation two regions are thus formed, one on each side of the STI region. These regions are characterized as a pFET region and an nFET region as they will form the pFET and nFET devices of the CMOS.

Figure 5:
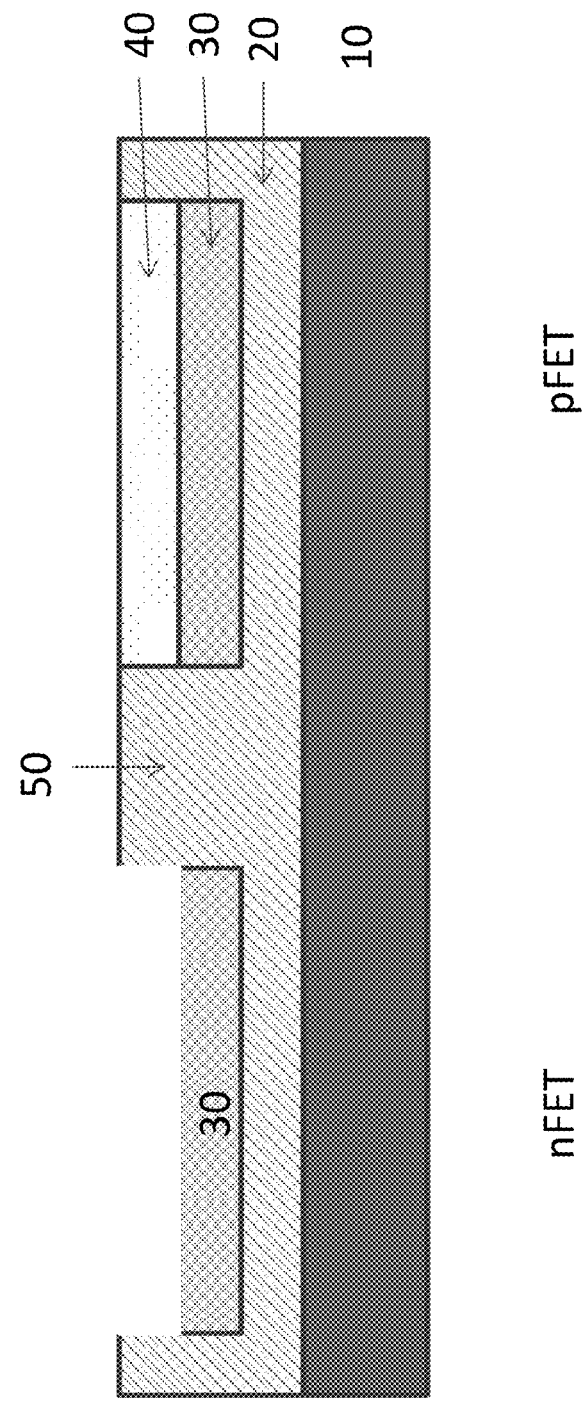
FIG. 5 illustrates an exemplary ETSOI structure with a SiGe epitaxial layer region removed from nFET region.

A series of process steps are conducted on the structure of FIG. 4 to result in a structure of FIG. 5 comprising substrate (10), BOX layer (20), unstrained semiconductor material layer (30) region, strained semiconductor material layer (40) region, and STI region (50). The strained semiconductor material layer (40) region on one side of the STI (50) is removed from an nFET region that will eventually be the nFET device. This process can involve masking the entire strained semiconductor material layer (40) of the structure of FIG. 4 with an appropriate masking material (not shown in the Figures). Suitable masking materials include, for example, silicon nitride (SiN), SiOCN, or SiBCN, silicon oxide, and the like. The masking material can selectively be removed from the nFET region while being retained in the pFET region. Suitable processes to remove the masking material depend on the masking material employed. For example, phosphoric acid can be used to etch silicon nitride selective to Si, SiGe, and silicon oxide. The strained semiconductor material layer (40) located in the nFET region is removed using, for example, HCl gas phase at a temperature of about 550-700° C. The strained semiconductor material layer (40) from the nFET region and the masking material over the pFET region are removed and a process is used to result in the strained semiconductor material layer (40) adjacent to the BOX (20) as shown in FIG. 5.

Figure 6:
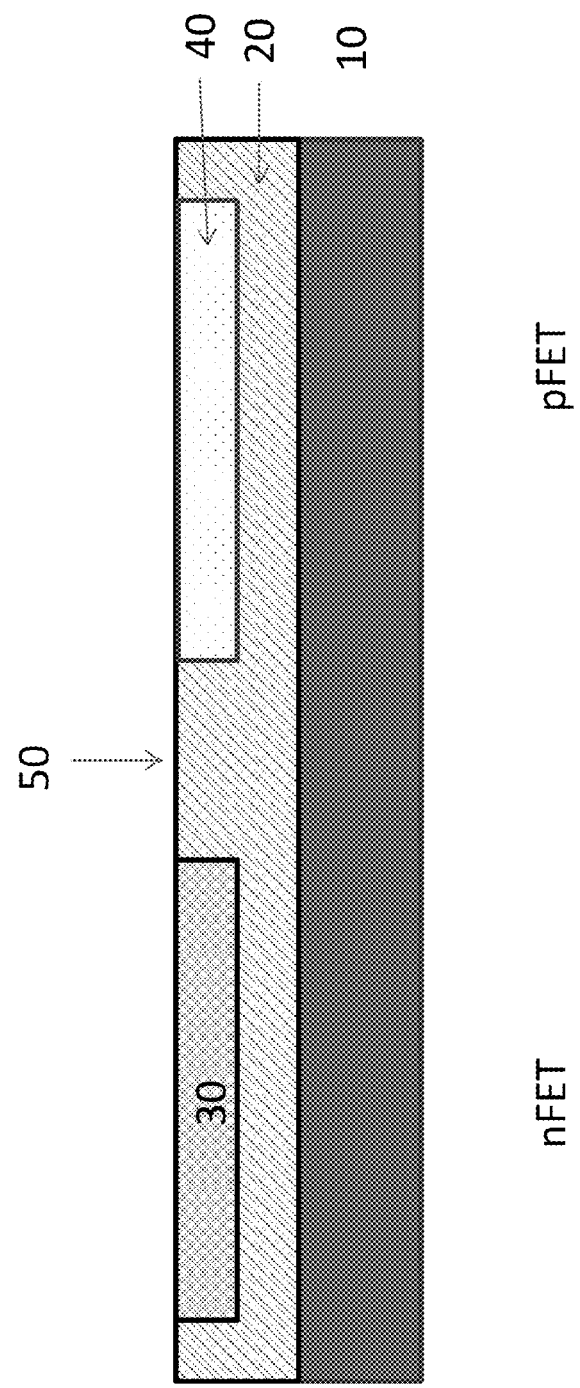
FIG. 6 illustrates an exemplary ETSOI structure with a SiGe epitaxial layer region in the pFET region and silicon (unstrained) in the nFET region.

In one process, a thermal annealing process is used to chemically mix the strained semiconductor material layer (40) and the unstrained semiconductor material layer (30) located in the pFET region to result in a structure comprising the unstrained semiconductor material layer (30) in the nFET region and the strained semiconductor material layer (40) in the pFET region as shown in FIG. 6. The thermal annealing process can involve heating to a temperature of about 900 to about 1150° C. for a sufficient time to effect the chemical mixing process. This embodiment results in a strained semiconductor material layer in the pFET region that is thicker than the unstrained semiconductor material layer in the nFET region. In an alternative embodiment (so-called "condensation" process), the thermal annealing is conducted in the presence of oxygen to result in a strained SiGe semiconductor material layer in the pFET region that is substantially the same thickness as the unstrained semiconductor material layer in the nFET region. During condensation process, silicon in SiGe layer reacts with oxygen to form silicon oxide while germanium is repelled to the underlying ETSOI layer to form strained SiGe.

The structure of FIG. 6 is covered with a pad layer (60), i.e. any type sacrificial layer material such as a nitride, oxide, or a combination thereof. The appropriate type of pad layer material can be chosen based upon the particular unstrained semiconductor material and strained semiconductor material used in the device formation. A plurality of sacrificial mandrels (70, 80) is formed on the surface of the pad layer (60). A plurality of nFET region sacrificial mandrels (70) comprising nFET region mandrel spacings (S1) are formed in the nFET region. A plurality of pFET region sacrificial mandrels (80) comprising pFET region mandrel spacings (S2) are formed in the pFET region. The process involves the formation of mandrel spacings S1 and S2 where the width of S1 is smaller than the width of S2. Examples of the sacrificial mandrels include but are not limited to, amorphous silicon, amorphous carbon, and the like.

Figure 7:
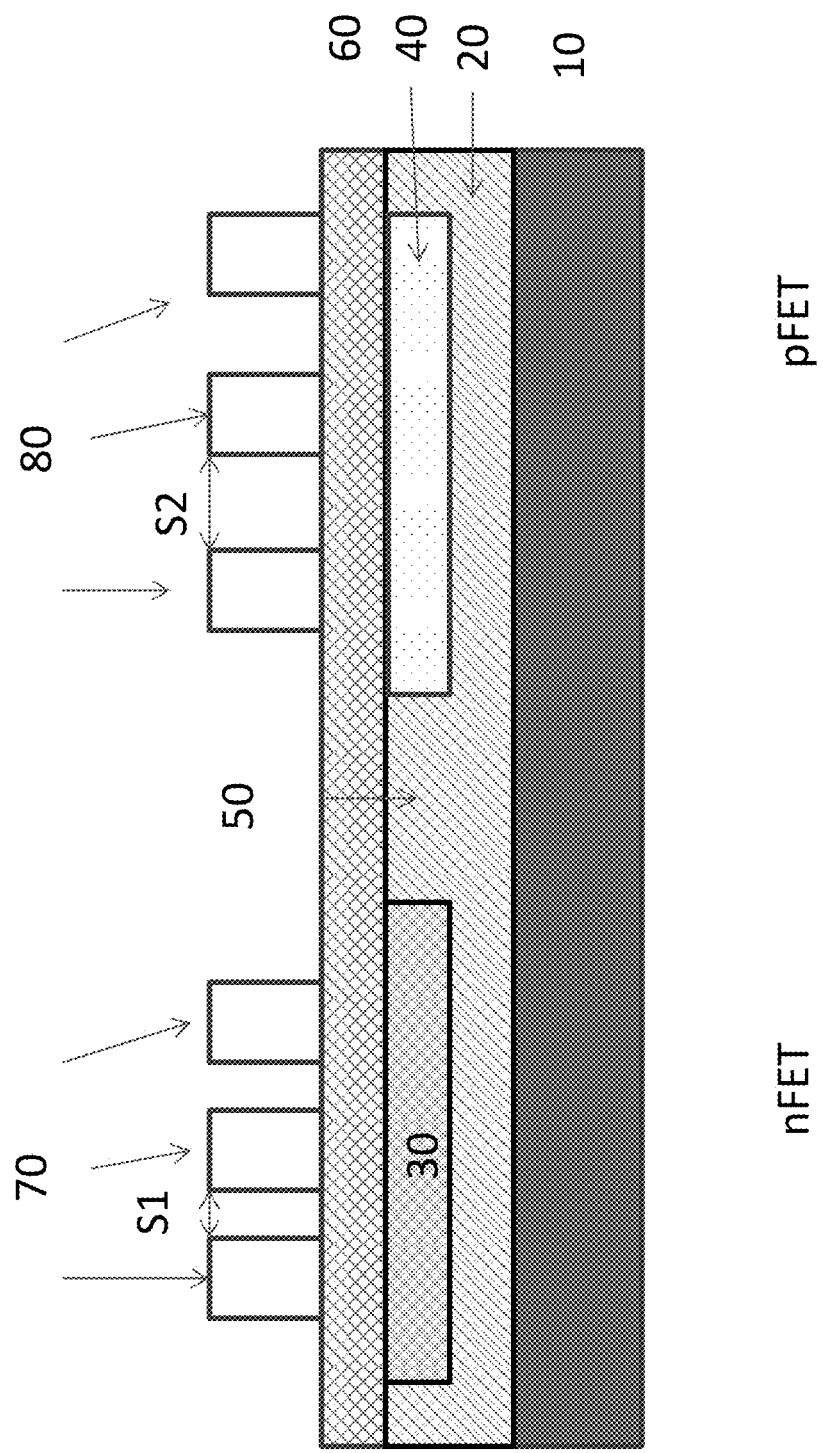
FIG. 7 illustrates an exemplary ETSOI structure with a plurality of sacrificial mandrels having a narrower spacing width (S1) in the nFET region and wider spacing width (S2) in the pFET region.
Figure 8:
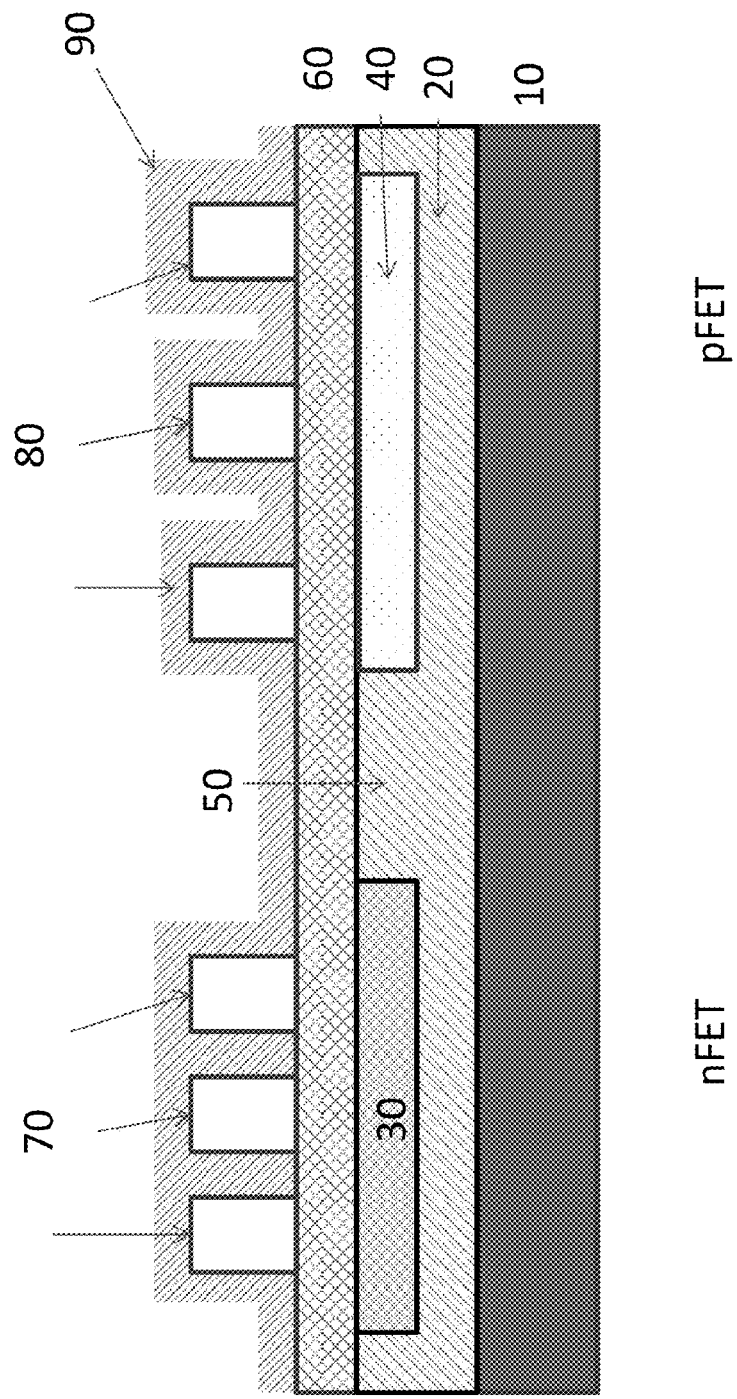
FIG. 8 illustrates an exemplary ETSOI structure of FIG. 7 where a conformal spacer material has been deposited over the plurality of sacrificial mandrels such that the conformal spacer material thickness (t) is greater than half of S1, but less than half of S2.

FIG. 8 illustrates an exemplary ETSOI structure of FIG. 7 where a conformal spacer material (90) has been uniformly deposited over the plurality of sacrificial mandrels (70, 80) such that the conformal spacer material thickness (t) is greater than half the width of S1, but less than half the width of S2. Thus, the spacing between the plurality of nFET region sacrificial mandrels (70) are completely filled with the conformal spacer material (90) to result in a pinch-off of the spacings, while there are gaps remaining between the plurality of pFET region sacrificial mandrels (80) and no pinch-off in the pFET region. The conformal spacer material can be, for example, a nitride or oxide material and the like. The conformal spacer material can be deposited by a conformal process such as atomic layer deposition (ALD), low-pressure chemical vapor deposition (LPCVD), or another suitable process. In one embodiment, S2 is about 10 nm or more than S1. In another embodiment, S1 is about 20 nm and S2 is about 40 nm.

Figure 9:
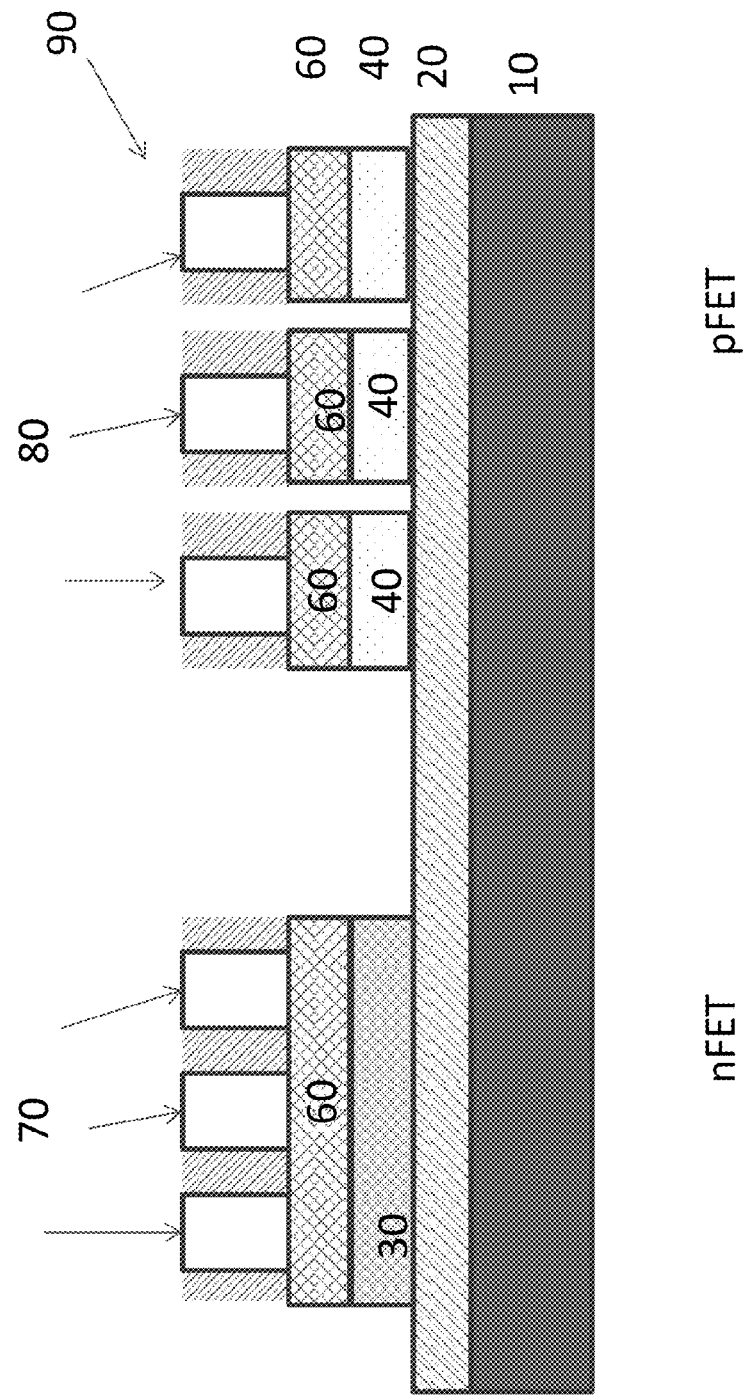
FIG. 9 illustrates the result of directional RIE on the structure of FIG. 8 resulting in narrow stripes of SiGe with small gaps between the stripes in the pFET region and a wide S1 stripe in the nFET region.

A directional reactive ion etching (RIE) process is performed to remove the horizontal surface conformal spacer material (90) and all exposed horizontal regions of the pad layer (60), semiconductor layer (30), and epitaxial film (40) as shown in FIG. 9. The RIE process does not substantially remove material from the side walls of the sacrificial mandrels (70, 80). This etching process results in a plurality of parallel strained semiconductor material (40) stripes in the pFET region where there are small gaps between the stripes. In an embodiment, the strained semiconductor material stripes are uniaxially strained. The etching process further results in a solid region of unstrained semiconductor material (30) in the nFET region; "solid region" means there are substantially no gaps in the unstrained semiconductor material.

Figure 10:
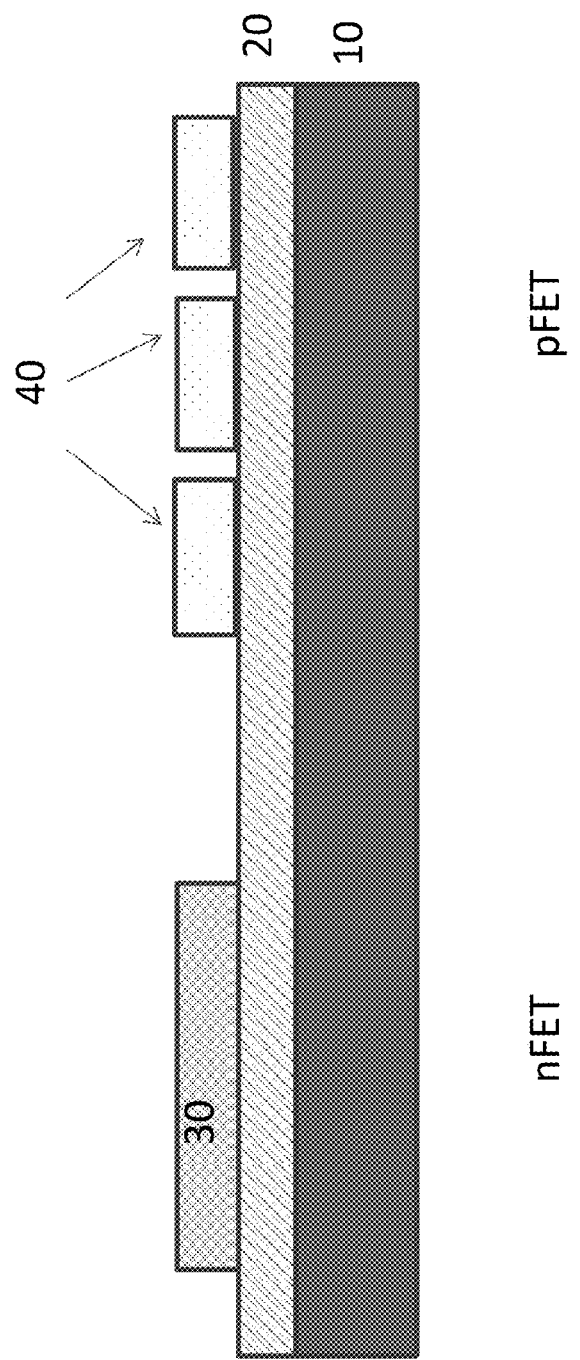
FIG. 10 illustrates the result of removing the conformal spacer material, plurality of sacrificial mandrels, and pad film of the structure in FIG. 9.

The plurality of sacrificial mandrels (70, 80) are removed along with the remaining conformal spacer material (90), and the pad layer (60) to result in a pFET region comprising parallel strained semiconductor material (40) stripes having small gaps between the stripes, and a nFET region comprising a solid region of unstrained semiconductor material (30) with no gaps as shown in FIG. 10. In an embodiment, the parallel strained semiconductor material (40) stripes have width ranges from about 20 nm to about 80 nm and the length is at least 3 times greater than the width, more specifically at least 4 times greater, and yet more specifically at least 5 times greater. Within this embodiment, the small gaps between the parallel strained semiconductor material (40) stripes has a width of less than or equal to 20 nm, specifically less than or equal to 18 nm, and yet more specifically less than or equal to 15 nm. The solid region of unstrained semiconductor material (30) with no gaps can have a length substantially the same as the length of the parallel strained semiconductor material (40) stripes. The solid region of unstrained semiconductor material (30) with no gaps can have a width that is greater than 3 times the width of the parallel strained semiconductor material (40) stripe width. In an embodiment, the solid region of unstrained semiconductor material (30) with no gaps can have a width that is about 60 nm to about 2400 nm.

The structure in FIG. 10 can be prepared into a ETSOI CMOS (2) by the addition of gates (100) as shown in FIG. 11A (side view) and FIG. 11B (top view). The gates typically include a gate dielectric and a gate conductor. Exemplary gate dielectric material includes silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Exemplary gate conductor material includes polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

After providing the structure shown in FIG. 11A and FIG. 11B further CMOS device processing steps (not specifically shown in the Figures) can be performed. The further CMOS device processing steps can include forming spacers, source/drain, contacts, wires, etc.

Those skilled in the art will appreciate that the exemplary structures discussed above can be distributed in raw form or incorporated as parts of intermediate products or end products that benefit from having ETSOI CMOS devices therein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof. The endpoints of all ranges directed to the same component or property are inclusive of the endpoints, are independently combinable, and include all intermediate points and ranges.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming on a structure comprising a pad layer covering a surface of an nFET region, a pFET region, and a shallow trench isolation (STI) region a plurality of nFET region sacrificial mandrels on the surface of the pad layer in the nFET region and a plurality of pFET region sacrificial mandrels on the surface of the pad layer in the pFET region, wherein the nFET region contains an unstrained semiconductor material and the pFET region comprises a strained semiconductor material;

depositing a conformal spacer material film on the surface of the plurality of nFET region sacrificial mandrels, plurality of pFET region sacrificial mandrels, and exposed pad layer;

etching to selectively remove conformal spacer material, exposed pad layer, strained semiconductor material, and unstrained semiconductor material layer; and removing remaining conformal spacer material film, the plurality of nFET and pFET sacrificial mandrels, and remaining pad layer to result in a complimentary structure, wherein the complimentary structure comprises the nFET region comprising a solid region of unstrained semiconductor material, and the pFET region comprising a plurality of parallel strained semiconductor material stripes separated by gaps.

2. The method of claim 1, wherein
the nFET region sacrificial mandrels comprise nFET region mandrel spacing widths (S1) and the pFET region sacrificial mandrels comprise pFET region mandrel spacing widths (S2), wherein S1 is smaller than S2; and
the conformal spacer material film having a thickness (t) that is greater than half of S1 and less than half of S2.

3. The method of claim 1, further comprising
providing an semiconductor on insulator (SOI) substrate comprising a buried oxide (BOX) layer, an unstrained semiconductor material layer contacting the surface of the BOX layer, and a blanket strained semiconductor material layer on the surface of the unstrained semiconductor material layer opposite to the BOX layer;
forming a shallow trench isolation (STI) region by removing a portion of the blanket strained semiconductor material layer and unstrained semiconductor material layer to form an nFET region and a pFET region separated by the STI region;
providing a hardmask on the surface of the STI region, nFET region, and pFET region;
removing the hardmask and the blanket strained semiconductor material layer from the nFET region to expose the unstrained semiconductor material layer in the nFET region;
removing the hardmask from the pFET region and converting the unstrained semiconductor material layer and the blanket strained semiconductor material layer of the pFET region into a strained semiconductor material;
forming a pad layer over the surface of the STI region, the nFET region, and the pFET region to form the structure comprising a pad layer covering the surface of an nFET region, a pFET region, and a shallow trench isolation (STI) region.

4. The method of claim 1, wherein the strained semiconductor material is silicon-germanium, germanium, III-V compounds, II-V compounds, or a combination thereof.

5. The method of claim 1, wherein the unstrained semiconductor material is silicon, III-V compounds, II-V compounds, or a combination thereof.

6. The method of claim 1, wherein the strained semiconductor material layer is silicon-germanium epitaxial film and the unstrained semiconductor material is silicon.

7. The method of claim 1, wherein the etching is reactive-ion directional etching.

8. The method of claim 3, further comprising:
providing an semiconductor on insulator (SOI) substrate comprising a buried oxide (BOX) layer and an unstrained semiconductor material layer contacting the surface of the BOX layer; and
forming a blanket strained semiconductor material layer on the surface of the silicon layer of the SOI substrate.

9. The method of claim 1, further comprising forming the complementary structure into a CMOS device.

10. A method, comprising:
forming a shallow trench isolation (STI) region in a structure comprising a SOI substrate comprising a buried oxide (BOX) layer, an unstrained semiconductor material layer contacting a surface of the BOX layer, and a blanket strained semiconductor material layer on a surface of the unstrained semiconductor material layer opposite to the BOX layer by removing a portion of the blanket strained semiconductor material layer and unstrained semiconductor material layer to form an nFET region and a pFET region separated by the STI region, wherein the SOI has a thickness of about 1 to about 10 nm;
providing a hardmask on the surface of the STI region, nFET region, and pFET region;
removing the hardmask and the blanket strained semiconductor material layer from the nFET region to expose the unstrained semiconductor material layer in the nFET region;
removing the hardmask from the pFET region and converting the unstrained semiconductor material layer and the blanket strained semiconductor material layer of the pFET region into a strained semiconductor material channel;
forming a pad layer over the surface of the STI region, the nFET region, and the pFET region;
forming a plurality of nFET region sacrificial mandrels on the surface of the pad layer in the nFET region and a plurality of pFET region sacrificial mandrels on the surface of the pad layer in the pFET region,
the nFET region sacrificial mandrels comprising nFET region mandrel spacing widths (S1) and the pFET region sacrificial mandrels comprising pFET region mandrel spacing widths (S2), wherein S1 is smaller than S2;
depositing a conformal spacer material film on the surface of the plurality of nFET region sacrificial mandrels, plurality of pFET region sacrificial mandrels, and exposed pad layer, the conformal spacer material film having a thickness (t) that is greater than half of S1 and less than half of S2;
etching to selectively remove conformal spacer material, exposed pad layer, strained semiconductor material, and unstrained semiconductor material layer; and
removing remaining conformal spacer material film, the plurality of nFET and pFET sacrificial mandrels, and remaining pad layer to result in a complimentary structure,
wherein the complimentary structure comprises the nFET region comprising a solid region of unstrained semiconductor material, and the pFET region comprising a plurality of parallel strained semiconductor material stripes separated by gaps.

11. The method of claim 10, wherein the strained semiconductor material is silicon-germanium, germanium, III-V compounds, II-V compounds, or a combination thereof.

12. The method of claim 10, wherein the unstrained semiconductor material is silicon, III-V compounds, II-V compounds, or a combination thereof.

13. The method of claim 10, wherein the strained semiconductor material layer is silicon-germanium epitaxial film and the unstrained semiconductor material is silicon.

14. The method of claim 10, further comprising:
providing an semiconductor on insulator (SOI) substrate comprising a buried oxide (BOX) layer and an unstrained semiconductor material layer contacting the surface of the BOX layer; and
   forming a blanket strained semiconductor material layer on the surface of the silicon layer of the SOI substrate.

15. The method of claim 10, wherein the etching is reactive-ion directional etching.

16. The method of claim 10, further comprising forming the complementary structure into a CMOS device.

17. A complementary metal-oxide-semiconductor (CMOS) device, comprising
   an nFET device comprising a solid region of unstrained semiconductor material;
   a pFET device comprising parallel strained semiconductor material stripes separated by gaps, wherein the strained semiconductor material stripes are uniaxially strained, and the gap between the plurality of stripes is small enough to minimize drive current loss; and
   a shallow trench isolation (STI) region separating the nFET device and the pFET device.

18. The device of claim 17, wherein the strained semiconductor material is silicon-germanium, germanium, III-V compounds, II-V compounds, or a combination thereof.

19. The device of claim 17, wherein the unstrained semiconductor material is silicon, III-V compounds, II-V compounds, or a combination thereof.

20. The device of claim 17, wherein the strained semiconductor material is silicon-germanium and the unstrained semiconductor material is silicon.

* * * * *